United States Patent
Johnson et al.

(10) Patent No.: US 6,838,228 B2
(45) Date of Patent: Jan. 4, 2005

(54) SYSTEM TO ENABLE PHOTOLITHOGRAPHY ON SEVERE STRUCTURE TOPOLOGIES

(75) Inventors: Eric H. Johnson, Cumberland Center, ME (US); Michael W. Harley-Stead, Portland, ME (US)

(73) Assignee: Fairchild Semiconductor Corporation, South Portland, ME (US)

(*) Notice: Subject to any disclaimer, the term of this patent is extended or adjusted under 35 U.S.C. 154(b) by 0 days.

(21) Appl. No.: 09/854,813

(22) Filed: May 14, 2001

(65) Prior Publication Data

US 2002/0168589 A1 Nov. 14, 2002

(51) Int. Cl.[7] ............................. G03F 7/00; G06F 9/00
(52) U.S. Cl. ................... 430/322; 430/323; 430/324; 716/19; 716/20; 716/21
(58) Field of Search .................. 430/322–324, 430/311, 315, 317; 257/415–420; 264/401; 427/58; 716/19–21; 438/48–52, 760, 763, 778, 780, 782

(56) References Cited

U.S. PATENT DOCUMENTS

| | | | | |
|---|---|---|---|---|
| 5,481,475 A | * | 1/1996 | Young | 716/20 |
| 5,674,773 A | * | 10/1997 | Koh et al. | 438/396 |
| 5,804,084 A | * | 9/1998 | Nasby et al. | 216/2 |
| 5,919,548 A | * | 7/1999 | Barron et al. | 428/138 |
| 5,963,788 A | * | 10/1999 | Barron et al. | 438/48 |
| 6,103,399 A | * | 8/2000 | Smela et al. | 428/623 |
| 6,355,387 B1 | * | 3/2002 | Fujinaga et al. | 430/30 |
| 2003/0237064 A1 | * | 12/2003 | White et al. | 716/5 |

OTHER PUBLICATIONS

J.Olsen and F.Moghadam, "Planarization Techniques", in Handbook of Multilevel Metallization for Integrated Circuits, S.R.Wilson and C.J.Tracy Eds.; Noyes, NY(1993), pp. 346–460.*

* cited by examiner

Primary Examiner—John A. McPherson
Assistant Examiner—Kripa Sagar
(74) Attorney, Agent, or Firm—Cesari and McKenna, LLP

(57) ABSTRACT

A system and related process to enable control of photolithographic pattern features on a structure having one or more severe non-flat topologies. The system includes an analysis of the Depth of Focus associated with photolithographic equipment and a photoresist film applied to the structure. From that determination a range of layout dimension of the topologies is identified accordingly and incorporated into the fabrication of such topologies. A conformal layer of material is then applied to the formed structure including the determined topologies to effectively substantially close up the topologies prior to application of the photoresist film. The system is suitable for use with any structure having severe topologies and photolithographic limitations including, for example, in the fabrication of micro-electro mechanical systems.

24 Claims, 3 Drawing Sheets

SYSTEM TO ENABLE PHOTOLITHOGRAPHY ON SEVERE STRUCTURE TOPOLOGIES

BACKGROUND OF THE INVENTION

1. Field of the Invention

The present invention relates to the process of fabricating structures having severe topologies including, but not limited to, semiconductor structures. In particular, the present invention relates to an arrangement to planarize such structures to enable effective photolithography.

2. Description of the Prior Art

A variety of structures, including semiconductor structures, are fabricated using a series of steps to build layers of materials, each layer having properties determined by the fabrication process. Among many steps, the process includes the addition of material to the surface of a semiconductor wafer substrate and the removal of certain portions of that material to define various active (conductive) and insulative regions in subsequent steps. The relationship among those various regions defines the characteristics of the structure. Material is added and removed, molecules inserted in certain sections, and thermal processing is carried out before conformal materials are applied to create a relatively flat surface of the structure substantially enclosing the various regions of material. The basic processing steps involved are generally well known to those skilled in the art and vary as a function of the particular devices desired.

In order to create devices that function as desired, it is important to establish the locations and sizes of the various regions as accurately as possible. The siting of those three-dimensional regions is defined either by self-alignment—the positioning of adjacent and/or covering layers of material— or by photolithography. Photolithography is the process of transferring an image to the surface of the semiconductor substrate by means of a light sensitive polymeric film. The film is first applied to the surface of a substrate and a mask is then used to establish opaque and transparent regions matching the desired pattern to be formed in the substrate. The mask is fabricated such that when light passes through the transparent regions, the underlying film is either cured or made soluble in those areas exposed to the light source. The film is then subjected to a chemical solution to remove unexposed film or exposed film, dependent upon the particular film type (positive or negative) employed. With that patterned film in place, process steps may be carried out at those sites where the film has been removed. The regions of the substrate where the film remains are "protected" from the process operations. For example, semiconductor material in the unprotected area may be removed by etching.

Photolithography works best when the film is applied to a flat surface. When the film is applied to a flat surface, it settles to a thickness that is substantially uniform. The light required to cure or make the film more soluble is generated by a source that produces enough energy to change the condition of the film completely through its thickness. Existing photolithographic equipment or "steppers" produce light of a wavelength suitable to change the chemical state of the film. The light source of the stepper is arranged so that the focal point of the generated light beam is preferably targeted at the center of the thickness of the film. If the focal point is established too near the surface of the substrate, the film may be underexposed near the surface of the substrate. If the focal point is established near the surface of the substrate, the film may be badly exposed near the film's surface. The particular focal point to be established is dependent upon the wavelength of the light from the source, the thickness of the film, and any non-planarity of the substrate to which the film is applied.

When the film thickness is uniform and substantially on a single plane, and the source wavelength is known, required "minimum energy to clear" is constant. In addition, when the substrate surface is substantially on one plane, the required Depth of Focus (DOF) is also constant. However, when the substrate surface is not completely flat; that is, when it is topographical, the film layer is not of uniform thickness and the height of the film surface varies. Non-uniformity of thickness may occur when there are pockets, channels, slots, etc., in the surface of the substrate. In those cases, the film material, when first applied to the substrate, fills in such areas and will necessarily be thicker in those localized areas. The thickest part of the film determines the greatest amount of light energy required to convert the film to the required properties either to make it sufficiently soluble or sufficiently cured. That required energy is the minimum energy to clear. As might be expected, the minimum energy to clear is greatest where the film is thickest and least where it is thinnest. However, steppers of the type used in most commercial semiconductor fabrication applications, for example, do not provide selectable localized changes in the light energy applied to the film. Attempts to supply enough energy to adequately affect the deepest part of the film will overexpose the thinnest part, rendering the film unacceptable.

When the substrate surface is non-planar, the film may be of substantially uniform thickness on the entire surface except, perhaps, where it transitions from one plane to another. However, when the overall height of the substrate varies from one region to another, the light source's distance from the substrate surface is variable. Since commercially available steppers direct the light from a fixed position, the focus setting or DOF established to affect the film at one region of the substrate is not suitable to affect the film at a region of different height. A solution to this problem involves creating multiple focus settings as a function of the number of surface height changes. Two or more superimposed lithographic exposures are used to create a deeper effective DOF. This is suitable for surface height variations of modest difference. However, for greater changes, image contrast is compromised such that the film is unsuitable for use in some regions.

There has been recent interest in possible commercial applications of the combination of microelectronics and micromechanical structures. These miniaturized structures, sometimes referred to as Micro-Electro-Mechanical Systems (MEMS), may be employed as optical controllers, such as for miniaturized mirrors; as pressure sensors, such as for automotive applications; as pumps, motors, chemical sensor controllers, controllable infusion devices for medical applications, among an array of uses requiring control systems and mechanized elements scaled to the size of integrated circuitry. Although such types of devices have been developed on a very small scale for certain specific regulated applications, broader applicability requires suitable fabrication processes to make them commercially viable. The nature of these microelectronic/ micromechanical systems, however, necessarily involves the formation of structures having severe topologies. That is, the microscopic-scaled structures required to create the mirrors, or pumps, or motors, etc., as well as the related control electronics, will require the creation of deep wells, high pedestals, and the like, resulting in severe differences in photolithographic film thickness across the entire structure. Such severe differences cannot always be resolved with existing commercial steppers and semiconductor fabrication processes. That is, the dimensions of the severe structural variations may in some cases be too great to enable resolution of DOF requirements.

Therefore, what is needed is a system and related process steps to improve or enable microlithography on severe, non-flat (non-uniform planar) topologies using commercial fabrication equipment. What is needed in particular is a system and related process steps to minimize variations in minimum energy to clear and required DOF for photoresist film applied to semiconductor-based structures having severe topologies. Further, what is needed is such a system and related steps that may be incorporated into conventional structure fabrication methods, including those employed in making semiconductor structures.

SUMMARY OF THE INVENTION

It is an object of the present invention to provide a system and related process steps to improve or enable microlithography on severe, non-flat (non-uniform planar) topology using commercial fabrication equipment. It is an object of the present invention to provide a system and related process steps to minimize variations in minimum energy to clear and required DOF for photoresist film applied to structures having severe topologies. It is also an object of the present invention to provide such a system and related steps that may be incorporated into conventional structure fabrication methods.

These and other objects are achieved in the present invention through a combination of design restrictions and process techniques resulting in modification to regions of severe topology of a small structure in process. In particular, determining the necessary design restrictions first involves an evaluation of the dimensions of deep surface contours including the depth and layout characteristics of such contours. That evaluation is made in relation to the particular operational specifications of the equipment used to affect the chemical properties of the photoresist film. Those specifications, including the wavelength of the light used to affect the film through and through, define the DOF associated with satisfactory film characteristic modification. Upon determination of the required DOF for a particular topology and the photoresist film applied to the structure associated with that topology, the limitations on the dimensions of the severe topology regions can be defined. Of course, those skilled in the art recognize that DOF is directly related to the wavelength of the light and the Numerical Aperture of the equipment employed.

The present invention further includes the process of restricting the layout dimensions of any deep cavities and applying a conformal film to such cavities to modify their depths. (As used herein, the "layout dimensions" of a cavity refer to the dimensions of the cavity as viewed from the top of the structure.) Specifically, the substrate having severe contours is fabricated such that the layout dimensions of each of the contours are small enough that the conformal film, whether applied in one layer or more, substantially or completely fills in those contours to improve the planarity of the substrate over its entire surface. The photoresist film may then be applied to the conformed surface and standard photolithography steps carried out without concern whether or not adequate exposure of the film occurs through its entire thickness.

Furthermore, the present invention permits narrower photolithographic pattern features by virtue of reducing DOF requirements, thereby allowing use of more advanced photolithographic equipment with smaller exposure wavelengths.

These and other advantages of the present invention will become apparent upon review of the following detailed description, the accompanying drawings, and the appended claims.

DESCRIPTION OF THE PREFERRED EMBODIMENT OF THE INVENTION

Figure 1:
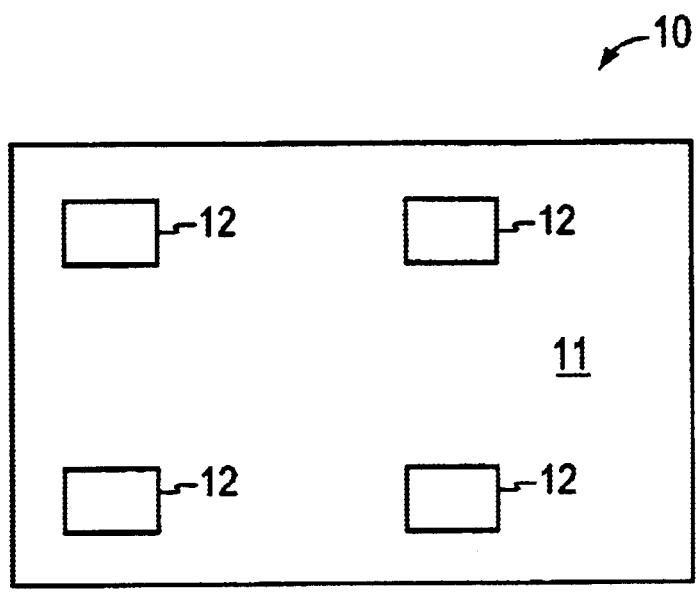
FIG. 1 is a simplified diagrammatic plan view of a representative semiconductor wafer having a plurality of severe topology regions of predetermined layout.

The present invention is a system and related process steps to substantially reduce, if not eliminate excess photoresist film thickness, and substantially reduce Depth of Focus (DOF) requirements, that would otherwise compromise photolithographic processing. In particular, the present invention resolves unworkable lithography pattern feature size control associated with extreme film thickness variations combined with stepper focus requirements. Specifically, relatively deep contours, holes, cavities, and the like are closed up using a conformal film deposition to reduce their depth and thereby reduce the photoresist film thickness variations such that control of feature sizes of a topographical semiconductor wafer is restored. While a particular embodiment of the present invention is described herein in relation to a semiconductor fabrication process, it is not limited thereto. Instead, it is suitable for any small-scale fabrication process in which severe topologies are present.

The primary steps associated with the solution of the present invention include a first step involving a confirmation or establishment of the characteristics of the photolithographic stepper employed to expose photoresist applied to a semiconductor structure including one or more severe topological features. The primary characteristics of importance are the beam wavelength and numerical aperture, which define the DOF. That understanding leads to the second step, which involves a determination of the photoresist film thickness acceptable for the required DOF associated with the particular stepper equipment employed and any additional attributes of the particular fabrication process. In addition, the particular expected dimensional characteristics of the severe topological regions of the wafer in process are calculated, measured, or otherwise determined. That is, the depth of such regions as well as their originally designed layout dimensions are then considered. The types of regions expected to be of importance include, but are not limited to, via holes, cavities, rings, trenches, and slots.

Armed with the information regarding the dimensions of the topological regions of concern and the operational characteristics of the photolithographic equipment, a range of acceptable layout dimensions of those topological regions are determined. That is, the layout dimensions of the regions are made sufficiently small so that subsequent conformal depositions "close up" or fill the regions prior to patterning a later process layer. The number of subsequent conformal depositions used to close up a region depends on the design of the structure being fabricated. In other words, if the structure design calls for deposition of a single conformal layer prior to a patterning process, then the layout dimensions are selected such that the single deposition fills the region. If the structure design calls for deposition of multiple conformal layers prior to a patterning process, then the layout dimensions are selected such that all or some of the depositions fill the region.

The determination of acceptable layout dimensions is made based on the region depth, the thickness and lateral fill characteristics of subsequent depositions of conformal materials, the characteristics of the area surrounding such region, i.e., whether it too is of significant depth, and the ability within the context of the semiconductor fabrication process to apply a material that will substantially fill the cavity, etc., as part of the wafer fabrication process. For example, if it is determined that a particular cavity has layout dimensions x and y that cannot be filled with one or more layers of conformal material(s), then the designed layout dimensions of such cavity are changed to x-a and y, x-a and y-b, or x and y-b, as a function of the determined required DOF and the cavity filling characteristics of the conformal materials. It is to be understood that x and y may or may not be equal and a and b may or may not be equal.

Upon determination of acceptable layout dimensions of the one or more deep cavities, standard semiconductor fabrication steps may be employed to complete the structure. That is, steps including, but not limited to, etching, deposition, implantation, and the like may be employed to create designed regions. In regard to the system of the present invention, the deep topologies may be formed within the range of acceptable dimensions using standard etching techniques, for example. Subsequent application of conformal materials such as oxides, amorphous silicon, and, polysilicon, for example, fill in the cavities. Of course, dependent upon the particular structure under fabrication, any sort of material may be used to produce the conformal layer, as long as the presence of the material is compatible or beneficial to device fabrication and application. Photoresist may then be applied to the conformed surface of the wafer and exposed using the photolithographic equipment. Although there may exist some photolithographic equipment that may be able to provide complete exposure of very deep cavities, the present invention is primarily directed to equipment that is in general commercial use and generally unable to generate deep DOF.

The primary fabrication steps associated with the system of the present invention are now described with respect to the simplified representation of an exemplar semiconductor structure as shown in FIGS. 1–6. In FIG. 1, a semiconductor structure 10 having a surface 11 includes a plurality of deep topological regions 12 that may be trenches, cavities, via holes, or the like. The regions 12 have been formed with layout dimensions calculated to be sufficiently limited to ensure that following fabrication sequences to be described herein substantially close up those regions prior to application of a photoresist film requiring exposure in the region.

Figure 2:
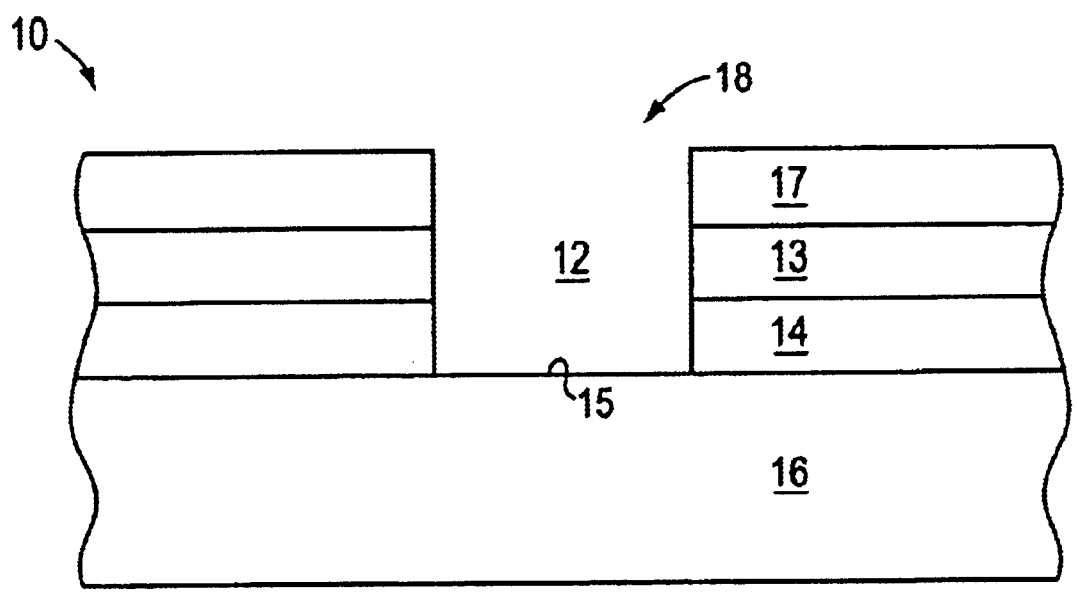
FIG. 2 is a simplified diagrammatic elevation view of a portion of the semiconductor wafer of FIG. 1.

As illustrated in FIG. 2, an exemplar deep region 12 is formed through an initial uniform nitride layer 13 and an initial oxide layer 14 to a substrate surface 15 that is the upper level of a substrate 16 that may be a primary wafer substrate, a grown epitaxial layer, or other subsurface region of particular conductivity. The layers shown are simply illustrative and are in no way to be limited to specific material types or conductivity types. Instead, they are shown as the types of layers typically formed in making semiconductor structures. The region 12 is preferably formed by applying a photoresist mask 17 to the surface of the nitride layer 13 and etching through an opening 18 therein to the surface 15 of substrate 16. The opening 18 of the mask 17 is configured with layout dimensions calculated as described with respect to the process summarized above.

Figure 3:
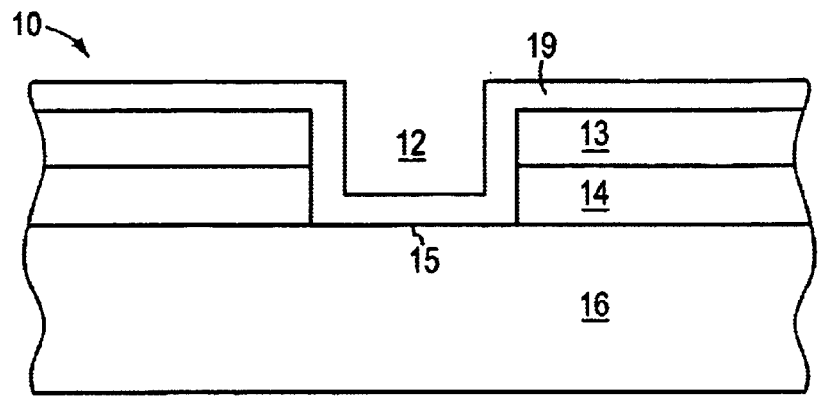
FIG. 3 is a simplified diagrammatic elevation view of the structure of FIG. 2 with a first conformal layer of semiconductor material on the surface of the wafer.

As illustrated in FIG. 3, the present invention further includes the addition of a first conformal layer of material 19 that is polysilicon but is not limited thereto. The first conformal layer 19 is deposited or otherwise applied to the surface of the nitride layer 13 in a blanket application, ensuring that the layer 19 fills in the region 12 to an extent. The first conformal layer 19 is preferably applied as part of a standard fabrication process for which the material of that layer may be used to form other discrete elements of a complete semiconductor structure on a wafer. The application of layer 19 is not intended in the particular process described herein to fill completely the region 12; however, it is contemplated that in some alternative processes such a first layer may substantially, if not completely, fill the region 12, dependent upon the particular dimensions of that cavity and the thickness and degree of conformality of the material used to form the layer 19.

Figure 4:
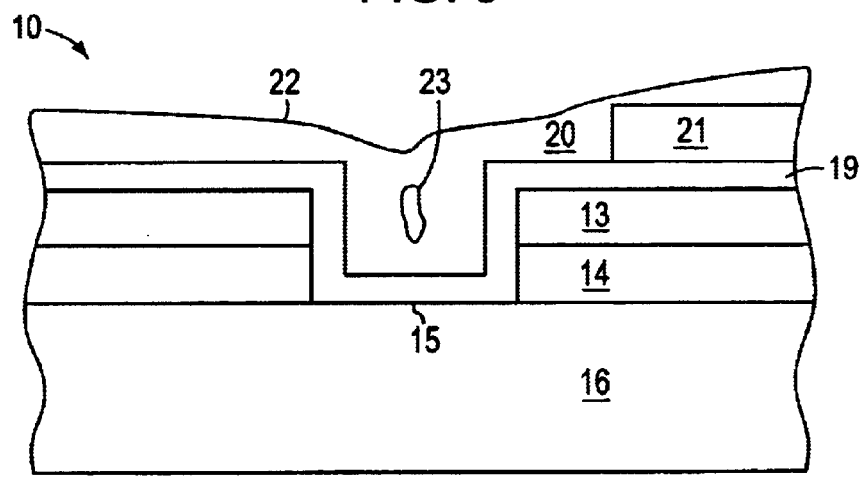
FIG. 4 is a simplified diagrammatic elevation view of the structure of FIG. 3 with a second conformal layer of material on the surface of the wafer showing the depth of the severe topological region substantially reduced.

FIG. 4 illustrates in a simplified way the structure in fabrication after the next primary steps of the process of the present invention. Specifically, a second conformal layer of material 20 is deposited or otherwise applied to the surface of the first layer 19 in a blanket application in the vicinity of, and within, the region 12. Additionally, for a semiconductor structure 10 including a plurality of planes of regions, such as is created by the introduction of isolation material including, but not limited to, oxide layers such as isolation oxide layer 21, the second conformal layer 20 is applied there as well. Preferably, the second layer 20 is also a polysilicon material. Again, however, it is contemplated that the present invention may be used to modify the severity of other severe topologies for other sorts of structures using other types of conformance-generating materials. It can be seen from the drawing that the layer 20 acts to fill the region 12 substantially, thereby substantially eliminating the severe topology transition from that area of the structure 10 associated with the isolation oxide layer 21. It is to be noted that in some instances while the application of layer 20 will provide a conformal surface 22, the region 12 may not fill completely. As a result, there may be a pocket 23 or void, sometimes referred to as a keyhole, without any fill material. It is to be noted, however, that the possible creation of a void is of no effect on the suitability of the present invention.

Figure 5:
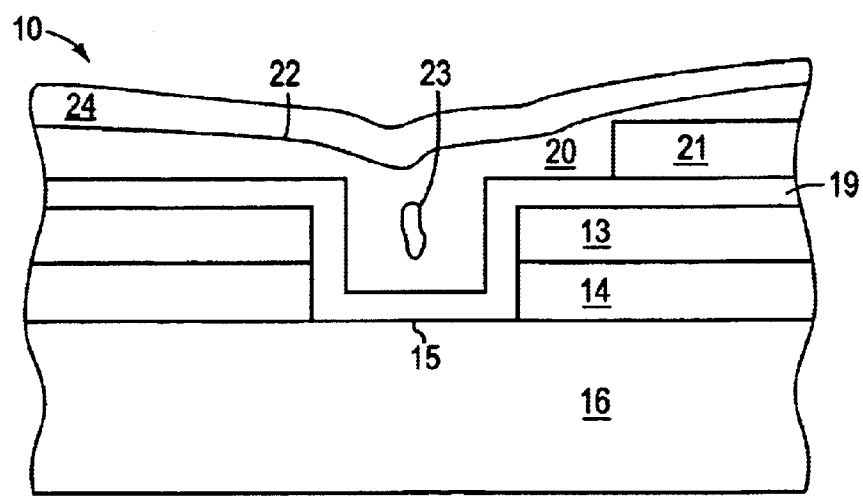
FIG. 5 is a simplified diagrammatic elevation view of the structure of FIG. 4 with an optional third conformal layer of material on the surface of the wafer.

As illustrated in FIG. 5, an optional third conformal layer of material 24 may be deposited or otherwise applied to the surface 22 of the second conformal layer 20 in a blanket application. This layer is optional and may be applied if part of a complete fabrication process such as in the formation of a MOS transistor or bipolar transistor. In this specific description, the third layer 24 may be an oxide layer providing insulation to the second conformal layer 20. The third conformal layer 24 may further reduce the variation in conformance in the area of the region 12 but is primarily expected to cover the layer 20 and may also provide a smoother transition from the area of the isolation layer 21 to the area adjacent to the region 12.

Figure 6:
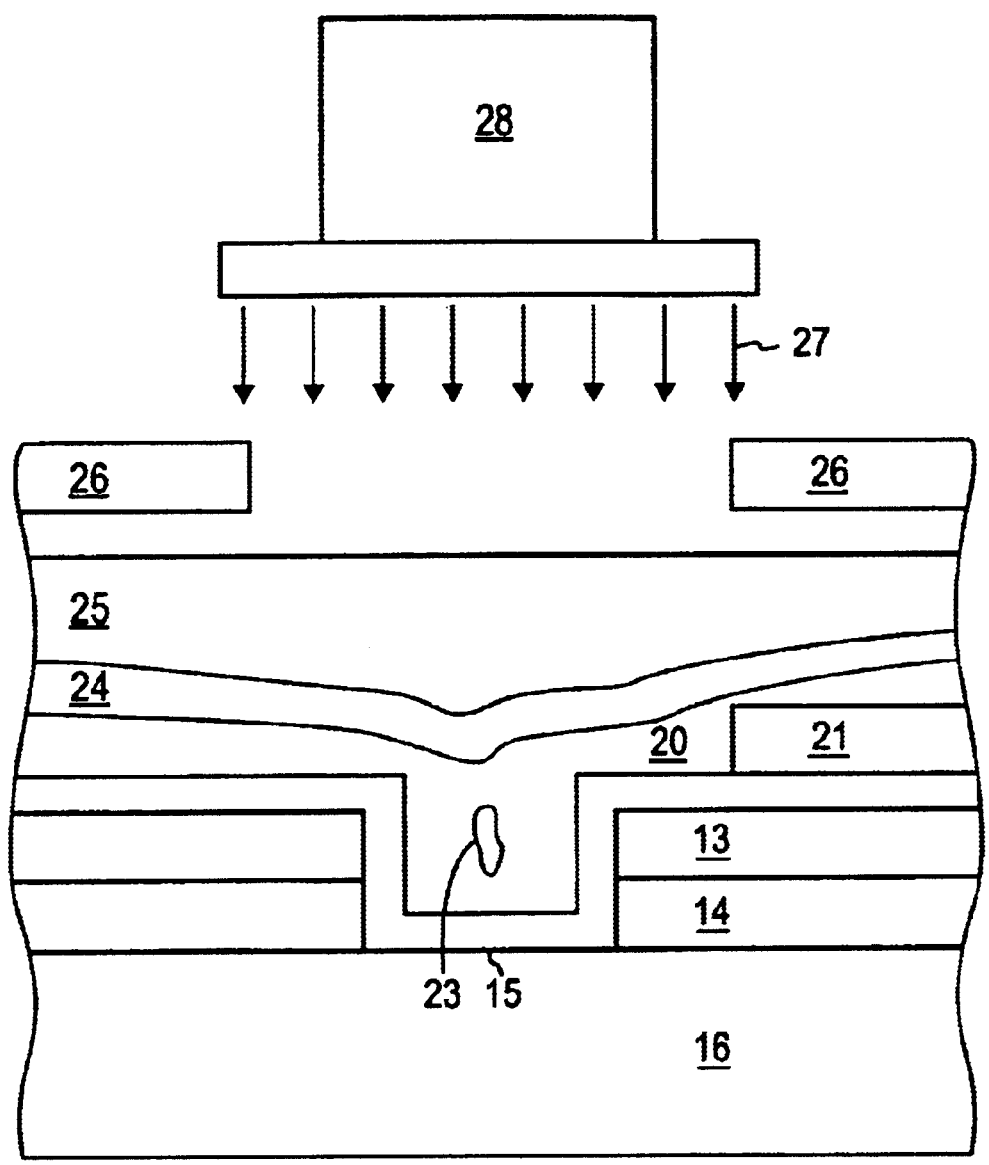
FIG. 6 is a simplified diagrammatic elevation view of the structure of FIG. 5 with a layer of photoresist film on the surface of the structure and showing an exemplar photolithographic stepper above the wafer exposing the photoresist film through a mask.

The determination of the appropriate dimensions of the opening 18 of the mask 17 and the addition of at least one of the conformal layers 19, 20, and 24 results in a relatively smooth surface of the structure 10 suitable for application of a photoresist film 25 that is of relatively uniform thickness although applied over a deep structural topology. As illustrated in FIG. 6, the film 25 may be applied to the surface of third conformal layer 24 using conventional application techniques. The film 25 may then be exposed through a mask 26 by light 27 directed from a standard photolithographic stepper 28. That stepper 28 may be operated in an ordinary fashion to expose the film 25 through and through.

The design rules and fabrication steps described herein may be employed in a wide array of applications. For example, any structure having one or more severe topology regions may be adjusted using the present invention to maintain the basic functionality of the severe topology regions without compromise to subsequent photolithography operations. Applications for which the present invention may be used include structures with via holes, micro-sized pump systems, micro-sized optical device systems, micro-sized medical implements, micro-sized chemical analysis devices, accelerometers, gyroscopes, microvalves, cantilevers, micromechanical resonators, and nanotubes.

While the invention has been described with reference to particular example embodiments, it is intended to cover all modifications and equivalents within the scope of the following claims.

What is claimed is:

1. A process to enable the control of photolithographic feature size on structures having one or more severe non-flat topologies defining regions of concern for the purpose of performing successful photolithography thereon using photolithographic equipment defining a wavelength source, a numerical aperture, photoresist, and conformal deposition or depositions, the process comprising the steps of:
   first determining a depth of focus from at least the wavelength of the source and the numeric aperture of the photolithographic equipment;
   second determining a thickness of the photoresist being used;
   third determining characteristics of the conformal depositions being used;
   evaluating the above first, second, and third determinations, determining from the evaluating one or more acceptable layout dimensions of the one or more severe non-flat topology regions of concern for satisfactory photolithographic processing wherein the regions of concern in the acceptable layout dimensions would be filled by depositions;
   rearranging the layout dimensions of the present structures such that the layout dimensions comply with the one or more acceptable layout dimensions.

2. The process as claimed in claim 1 wherein the step of evaluating said one or more layout dimensions of the one or more severe non-flat topologies includes comparing of the depth-of-focus of the particular photolithographic equipment and the thickness of a photoresist film applied to the surface of the structure against the severity of the non-flat topologies.

3. The process as claimed in claim 1 wherein the structure having a severe non-flat topology is a semiconductor structure and the step of forming the one or more severe non-flat topologies includes etching the semiconductor structure.

4. The process as claimed in claim 1 further including the step of applying a conformal layer of material onto the regions of concern.

5. The process as claimed in claim 4 wherein the step of applying said conformal layer of material includes applying a plurality of layers of conformal material on the structure having a severe non-flat topology including over the area of the formed one or more severe non-flat topologies.

6. The process as claimed in claim 5 wherein one or more of said plurality of layers of conformal material is polysilicon.

7. The process as claimed in claim 6 wherein one of said plurality of layers of conformal material is an insulative material.

8. The process as claimed in claim 5 wherein said one or more of plurality of layers are applied in a blanket deposition.

9. The process as claimed in claim 4 further comprising the step of applying a layer of photoresist material over said conformal layer.

10. A structure having a surface for receiving a photoresist film suitable for exposure by photolithographic equipment, the structure comprising: regions of concern in one or more severe non-flat topologies, wherein each of said one or more severe non-flat topologies is formed in accordance with layout dimensions that are acceptable for photolithographic processing as determined as a function of operational characteristics of the photolithographic equipment, photoresist thickness, and conformal depositions, and a filler to substantially fill in said regions of concern.

11. The structure as claimed in claim 10 wherein the determination of said layout dimensions is made based upon comparing the depth-of-focus of the particular photolithographic equipment and the thickness of a photoresist film applied to the surface of the structure against the severity of the non-flat topologies.

12. The structure as claimed in claim 10 wherein said one or more severe non-flat topologies are etched topologies.

13. The structure as claimed in claim 10 wherein the structure is a semiconductor structure and said filler is formed of a conformal layer of material on the semiconductor structure including over the area of the one or more severe non-flat topologies.

14. The structure as claimed in claim 13 wherein said conformal layer includes a plurality of layers of conformal material.

15. The structure as claimed in claim 14 wherein one or more of said plurality of layers of conformal material is polysilicon.

16. The structure as claimed in claim 15 wherein one of said plurality of layers of conformal material is an insulative material or a conductive material.

17. The structure as claimed in claim 14 wherein one or more of said plurality of layers is applied in a blanket deposition.

18. A micro-electro mechanical system including a structure having a surface for receiving a photoresist film suitable for exposure by photolithographic equipment, the micro-electro mechanical system comprising: one or more severe non-flat topologies defining regions of concern, wherein each of said one or more severe non-flat topologies is formed with layout dimensions changed, if necessary, as determined as a function of operational characteristics of the photolithographic equipment, photoresist thickness, and conformal depositions, and a filler to substantially fill in said regions of concern.

19. The device as claimed in claim 18 wherein said structure forms a portion of a mirror system.

20. The device as claimed in claim 18 wherein said structure forms a portion of a pump system.

21. The device as claimed in claim 18 wherein said structure forms a portion of a pressure sensor system.

22. The device as claimed in claim 18 wherein said structure forms a portion of a chemical sensor system.

23. The device as claimed in claim 18 wherein said structure forms a portion of an accelerometer system.

24. The device as claimed in claim 18 wherein said structure forms a portion of a micro sized medical implement.

* * * * *